United States Patent
Joseph et al.

(10) Patent No.: US 6,952,814 B2
(45) Date of Patent: Oct. 4, 2005

(54) METHOD AND APPARATUS FOR ESTABLISHMENT OF A DIE CONNECTION BUMP LAYOUT

(75) Inventors: Matthew M. Joseph, Milpitas, CA (US); Zuxu Qin, Stanford, CA (US)

(73) Assignee: Sun Microsystems Inc., Santa Clara, CA (US)

( * ) Notice: Subject to any disclaimer, the term of this patent is extended or adjusted under 35 U.S.C. 154(b) by 38 days.

(21) Appl. No.: 10/301,365
(22) Filed: Nov. 20, 2002
(65) Prior Publication Data

US 2004/0098690 A1 May 20, 2004

(51) Int. Cl.[7] .............................................. G06F 17/50
(52) U.S. Cl. .............................. 716/12; 716/13; 716/14
(58) Field of Search ............................... 716/12, 13, 14

(56) References Cited

U.S. PATENT DOCUMENTS

| | | | | |
|---|---|---|---|---|
| 5,041,903 A | * | 8/1991 | Millerick et al. | 257/676 |
| 5,747,874 A | * | 5/1998 | Seki et al. | 257/686 |
| 6,225,143 B1 | * | 5/2001 | Rao et al. | 438/106 |
| 6,734,046 B1 | * | 5/2004 | Dahl | 438/129 |

* cited by examiner

*Primary Examiner*—Matthew Smith
*Assistant Examiner*—Sun James Lin
(74) *Attorney, Agent, or Firm*—Martine Penilla & Gencarella, LLP

(57) ABSTRACT

A method and apparatus is provided by which a die designer can efficiently evaluate package routings associated with a die connection bump layout of a die. The die designer is equipped to determine appropriate placement of die connection bumps around a periphery of the die, designate signal and power assignments for die connection bumps, and check routings between die connection bumps and associated package pins. The die designer can efficiently iterate, without recourse to a package designer, through numerous die connection bump placement and assignment configurations to develop a die connection bump layout that is routable within a package. Thus, time required for iteration between the die designer and the package designer to establish a proper placement and assignment of die connection bumps is substantially reduced. Also, as design variables and constraints change during a die design process, the die designer can efficiently re-evaluate a die-to-package interface without recourse to the package designer.

26 Claims, 11 Drawing Sheets

METHOD AND APPARATUS FOR ESTABLISHMENT OF A DIE CONNECTION BUMP LAYOUT

BACKGROUND OF THE INVENTION

1. Field of the Invention

The present invention relates generally to microprocessor design, and more particularly, to establishing a die connection bump layout for defining an interface between a die and a package.

2. Description of the Related Art

Packaging is a common practice in microprocessor design and fabrication in which a die (i.e., a microchip) is attached to a package. In general, the package provides the die with a substantial lead system, physical protection, environmental protection, and heat dissipation. The primary function of the package is to provide the substantial lead system that allows connection of the die to a circuit board or an electronic device. This connection cannot be made directly due to the fragility of metal conduction systems used to interconnect components within the die. Thus, die conductors generally terminate in larger bonding pads around a periphery of the die. The die bonding pads are electrically and mechanically connected to corresponding inner leads on the package. The package provides a metal conduction system from the inner leads to corresponding outer leads which are mechanically stronger that the die conductors. In this manner, the package provides a more substantial lead system for connecting the die to the circuit board or other electronic device.

Connections between the die bonding pads and the corresponding package inner leads can be established by a number of known methods including a flip-chip and bump method. In the flip-chip and bump method, a metal bump is deposited on each die bonding pad. When the die is flipped over and placed on the package, each metal bump connects to a corresponding package inner lead. The mechanical and electrical connections between the die and the package are then established through a soldering process in which the metal bumps fuse with the inner leads of the package at an elevated temperature. The flip-chip and bump method is also referred to as controlled collapse chip connection or C4. Accordingly, the metal bumps can be referred to as die connection bumps or C4 bumps.

Accurate package modeling is necessary in microprocessor design to allow the input/output (IO) drivers and receivers to be properly designed, particularly where high frequency IO is utilized. An interface between the die and package should be established to allow accurate package modeling. Establishment of the interface also allows a die size to be firmly established for use in evaluating other issues such as die yield. Establishing the interface between the die and package involves an iterative process in which a large number of mechanical and electrical design variables and constraints are balanced.

Establishing the interface between the die and package generally constitutes determining the number and placement of die bonding pads (i.e., die connection bumps) around the periphery of the die. The number of die connection bumps is based on a required number of signal bumps and a required number of power bumps. The required number of power bumps is typically a function of a required signal-to-power ratio. Once the number and types of die connection bumps are determined, their placement is governed by both the die and package design requirements.

Customarily, die designers and package designers collaborate through an iterative process to establish the proper placement of die connection bumps. The die designers generally use a die connection bump layout tool to evaluate the die connection bump layout with respect to each mechanical and electrical consideration affecting the die design. The package designers generally use a package routing tool to evaluate the ability of the package inner lead locations (corresponding to die connection bump locations) to be properly routed to their corresponding package outer leads. The time required for iteration between the die designer and package designer to establish the proper placement of die connection bumps, coupled with the changing nature of design variables and constraints, can become a critical issue relative to an overall design process.

In view of the foregoing, there is a need for a method and apparatus by which the die designer can efficiently evaluate package routings associated with a given die connection bump layout without recourse to the package designer.

SUMMARY OF THE INVENTION

Broadly speaking, the present invention fills these needs by providing a method and an apparatus by which a die designer can efficiently evaluate package routings associated with a die connection bump layout of a die. Broadly speaking, the present invention allows the die designer to determine appropriate placement of die connection bumps around a periphery of the die, designate signal and power assignments for die connection bumps, and check routings between die connection bumps and associated package outer leads. It should be appreciated that the present invention can be implemented in numerous ways, including as a process, an apparatus, a system, a device, or a method. Several embodiments of the present invention are described below.

In one embodiment, a method for establishing a die connection bump layout is disclosed, wherein the die connection bump layout is routable within a package. A plurality of die connection bump locations and assignments are computed. The plurality of die connection bump locations are defined around a periphery of the die and correspond to a plurality of package inner lead locations. The periphery of the die is smaller than the periphery of the package. A plurality of routings between the plurality of package inner lead locations and a plurality of package outer lead locations are also computed. The plurality of package outer lead locations are defined around a periphery of the package. Rat crossings within the plurality of routings are identified, wherein a rat crossing occurs where an intersection exists between routings. The die connection bump layout is modified to avoid rat crossings. The die connection bump layout required to complete a package development is released. The released die connection bump layout includes any modifications made to avoid rat crossings.

In another embodiment, a method for determining a plurality of die connection bump locations and assignments is disclosed. The method includes establishing a coordinate system on a die. A first plurality of input necessary to define a die size and a die connection bump template is acquired. The first plurality of input is used to calculate a coordinate within the coordinate system on the die for each of the plurality of die connection bump locations. A second plurality of input necessary to determine an assignment for each of the plurality of die connection bump locations is acquired. A number of die connection bump locations are designated with a signal assignment. A number of die connection bump locations are designated with a power assignment. The coordinate and assignment for each of the plurality of die connection bump locations are output.

In another embodiment, a computer program embodied on a computer readable medium for determining a plurality of die connection bump locations and assignments is disclosed. The computer program includes program instructions for establishing a coordinate system on a die. Program instructions are also provided for acquiring a first plurality of input necessary to define a die size and a die connection bump template. Program instructions are also provided for using the first plurality of input to calculate a coordinate within the coordinate system on the die for each of the plurality of die connection bump locations. Program instructions are also provided for acquiring a second plurality of input necessary to determine an assignment for each of the plurality of die connection bump locations. The computer program includes further instructions for designating a signal assignment and a power assignment to a number of die connection bump locations. Program instructions are also provided for outputting the coordinate and the assignment for each of the plurality of die connection bump locations.

In another embodiment, a method for creating a plurality of package routings is disclosed. The method includes acquiring a first plurality of input. The first plurality of input includes coordinates on a die corresponding to each of a plurality of die connection bump locations. Each of the plurality of die connection bump locations corresponds to a location of one of a plurality of package inner leads. The method further includes acquiring a second plurality of input. The second plurality of input includes coordinates on a package corresponding to each of a plurality of package outer leads. The method also includes creating a plurality of routings between the plurality of package inner leads and the plurality of package outer leads. Each of the plurality of routings is a linear routing between a package inner lead and a package outer lead. The package inner lead and the package outer lead have a common signal assignment.

In another embodiment, a computer program embodied on a computer readable medium for creating a plurality of package routings is disclosed. The computer program includes program instructions for acquiring a first plurality of input. The first plurality of input includes coordinates on a die corresponding to each of a plurality of die connection bump locations. Each of the plurality of die connection bump locations corresponds to a location of one of a plurality of package inner leads. The computer program includes further program instructions for acquiring a second plurality of input. The second plurality of input includes coordinates on a package corresponding to each of a plurality of package outer leads. The computer program also includes program instructions for creating a plurality of routings between the plurality of package inner leads and the plurality of package outer leads. Each of the plurality of routings is a linear routing between a package inner lead and a package outer lead. The package inner lead and the package outer lead have a common signal assignment.

Other aspects of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a method and an apparatus by which a die designer can efficiently evaluate package routings associated with a die connection bump layout of a die. Broadly speaking, the present invention allows the die designer to determine appropriate placement of die connection bumps around a periphery of the die, designate signal and power assignments for die connection bumps, and check routings between die connection bumps and associated package pins. The present invention allows the die designer to efficiently iterate, without recourse to a package designer, through numerous die connection bump placement and assignment configurations to develop a die connection bump layout that is routable within a package. The present invention substantially reduces time required for iteration between the die designer and the package designer to establish a proper placement and assignment of die connection bumps. Also, as design variables and constraints change during a die design process, the present invention allows the die designer to efficiently adjust and re-evaluate a die-to-package interface without recourse to the package designer.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
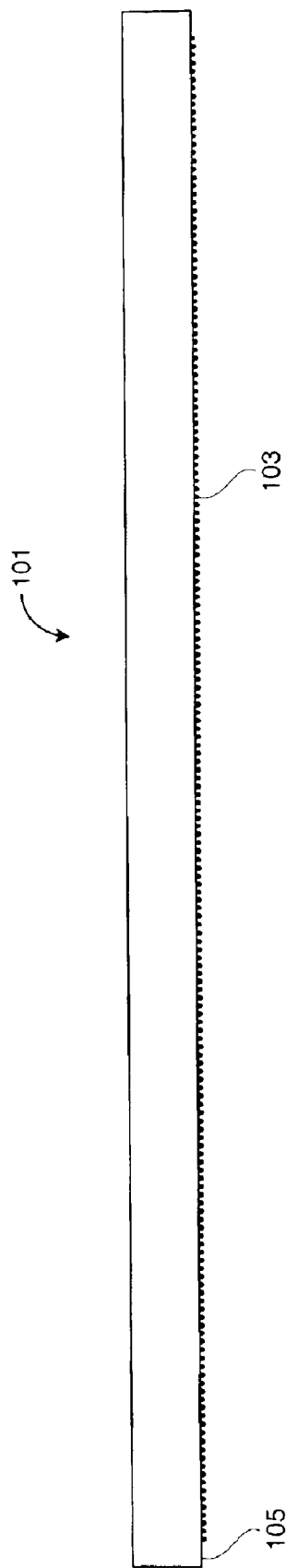
FIG. 1A is an illustration showing a front view of a die, in accordance with an exemplary embodiment of the present invention.

FIG. 1A is an illustration showing a front view of a die 101, in accordance with an exemplary embodiment of the present invention. The die 101 is a general representation of an integrated circuit device (e.g., microprocessor chip) that is to be attached to a package using a flip-chip attachment method. In the flip-chip attachment method, each of a plurality of die connection bumps 103 located on an underside 105 of the die 101 are mechanically and electrically connected to a corresponding package inner lead. Each package inner lead is routed through vias and package planes to a corresponding package outer lead. In general, each package outer lead can be connected to a receiving mechanism on another electronic component (e.g., printed circuit board). The package outer leads can be attached to the receiving mechanism on the other electronic component using any one of a number of attachment methods common to those skilled in the art (e.g., attachment pin). In this manner the package serves as a lead system to connect the die 101 to the other electronic component.

Figure 1B:
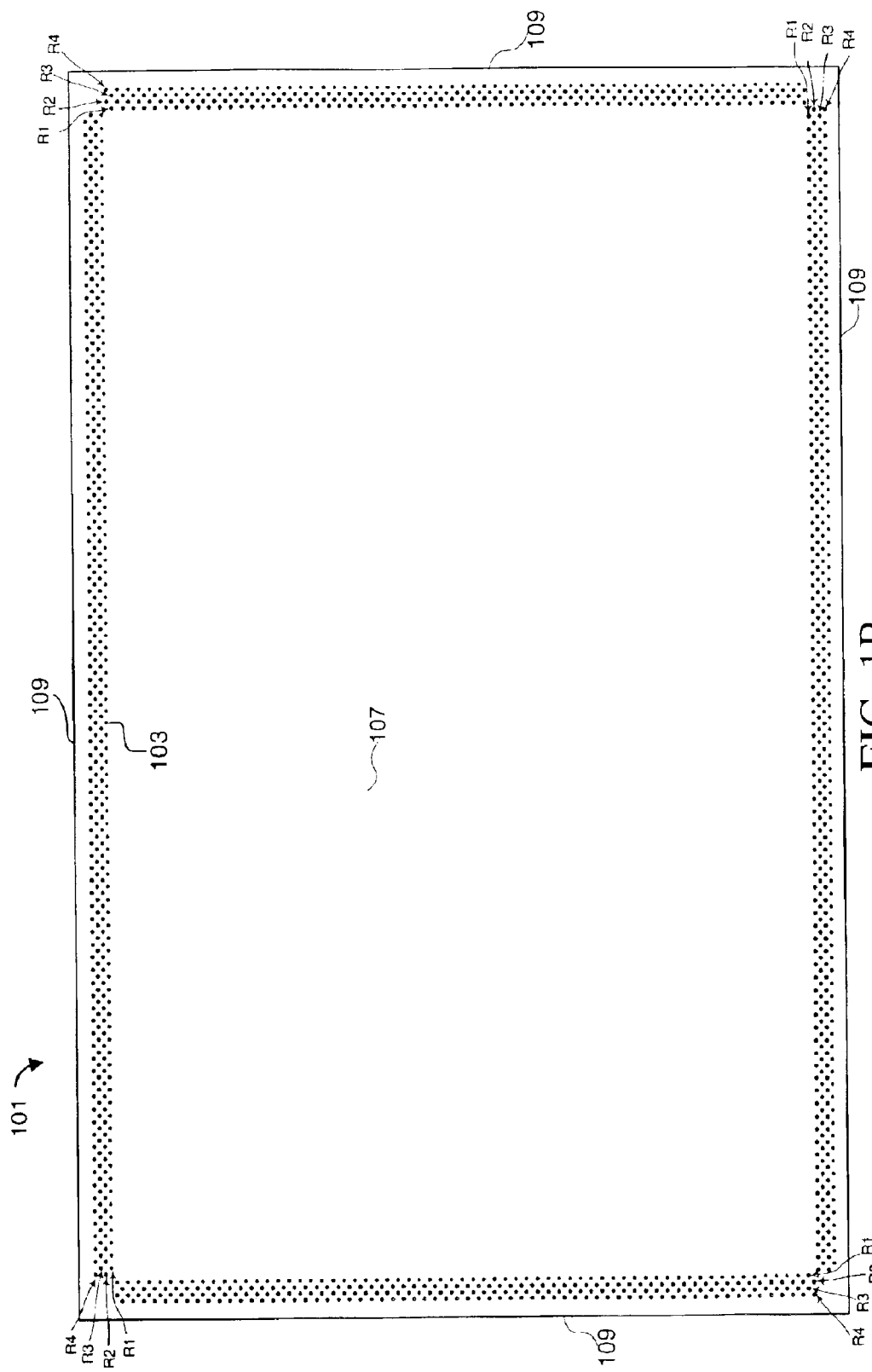
FIG. 1B is an illustration showing a bottom view of the die, in accordance with an exemplary embodiment of the present invention.

FIG. 1B is an illustration showing a bottom view of the die 101, in accordance with an exemplary embodiment of the present invention. The plurality of die connection bumps 103 are located around a periphery of the die 101. A core 107 of the die 101 is located inside the plurality of die connection bumps 103. The core 107 of the die also includes a number of core bumps (not shown). Scribe sides 109 of the die 101 are located outside the plurality of die connection bumps 103. The plurality of die connection bumps 103 are generally placed in a number of rows oriented parallel to the scribe sides 109. In the exemplary embodiment of FIG. 1B, four rows (R1, R2, R3, and R4) of die connection bumps are shown; however, a different number of die connection bump rows may be implemented depending on the design characteristics of the die 101.

Figure 2A:
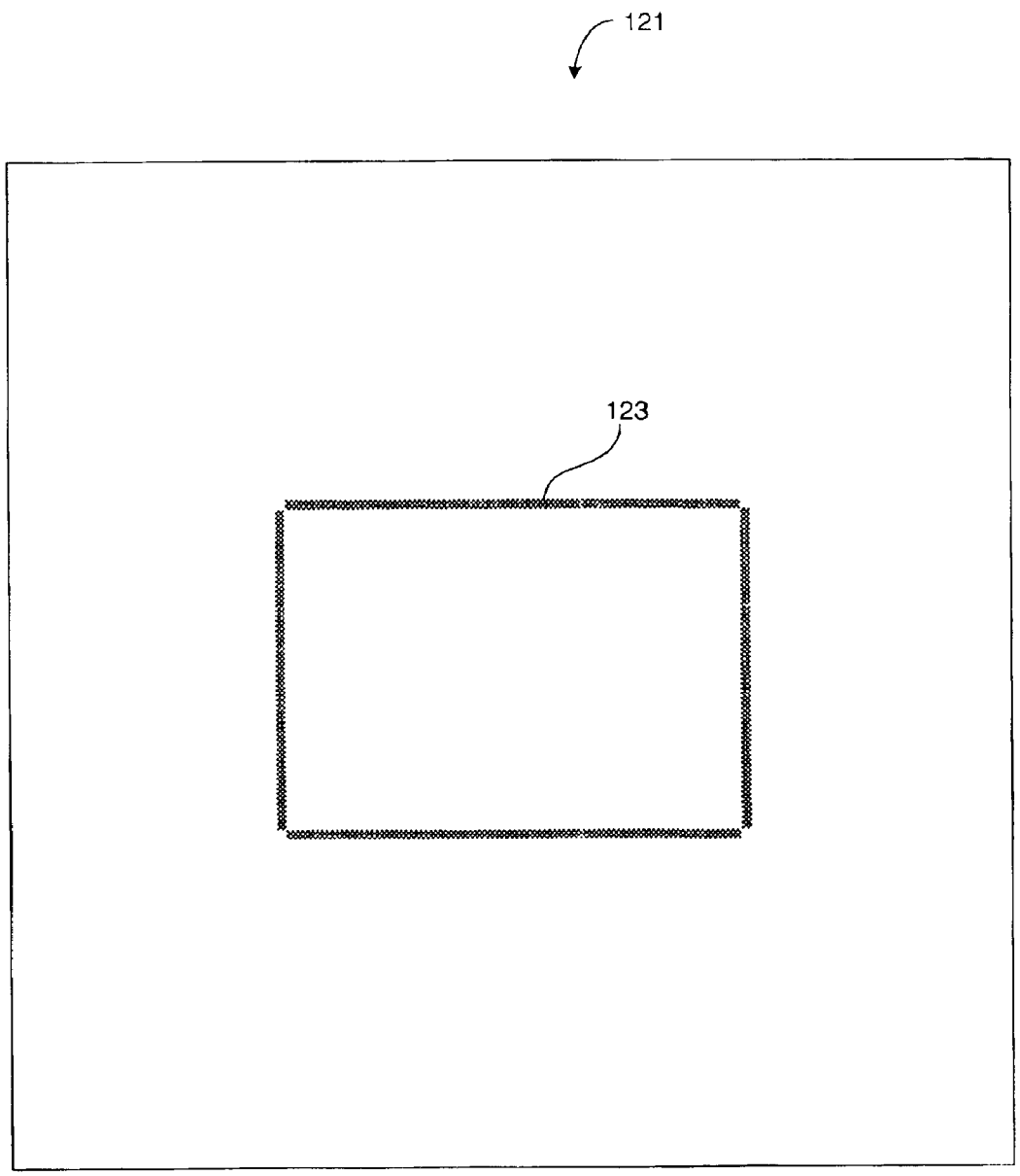
FIG. 2A is an illustration showing a top view of a package, in accordance with an exemplary embodiment of the present invention.

FIG. 2A is an illustration showing a top view of a package 121, in accordance with an exemplary embodiment of the present invention. The package 121 has a plurality of inner leads 123 configured to receive each of the plurality of die connection bumps 103 located on the underside 105 of the die 101. Each of the plurality of inner leads 123 is routed through the package to reach a corresponding outer lead. The package 121 also includes a plurality of core bump inner leads (not shown) configured to be connected to the number of core bumps of the die 101. The number of core bumps are generally routed from the plurality of core bump inner leads, through vias, to power planes within the package 121 that are connected to package 121 pin-outs.

Figure 2B:
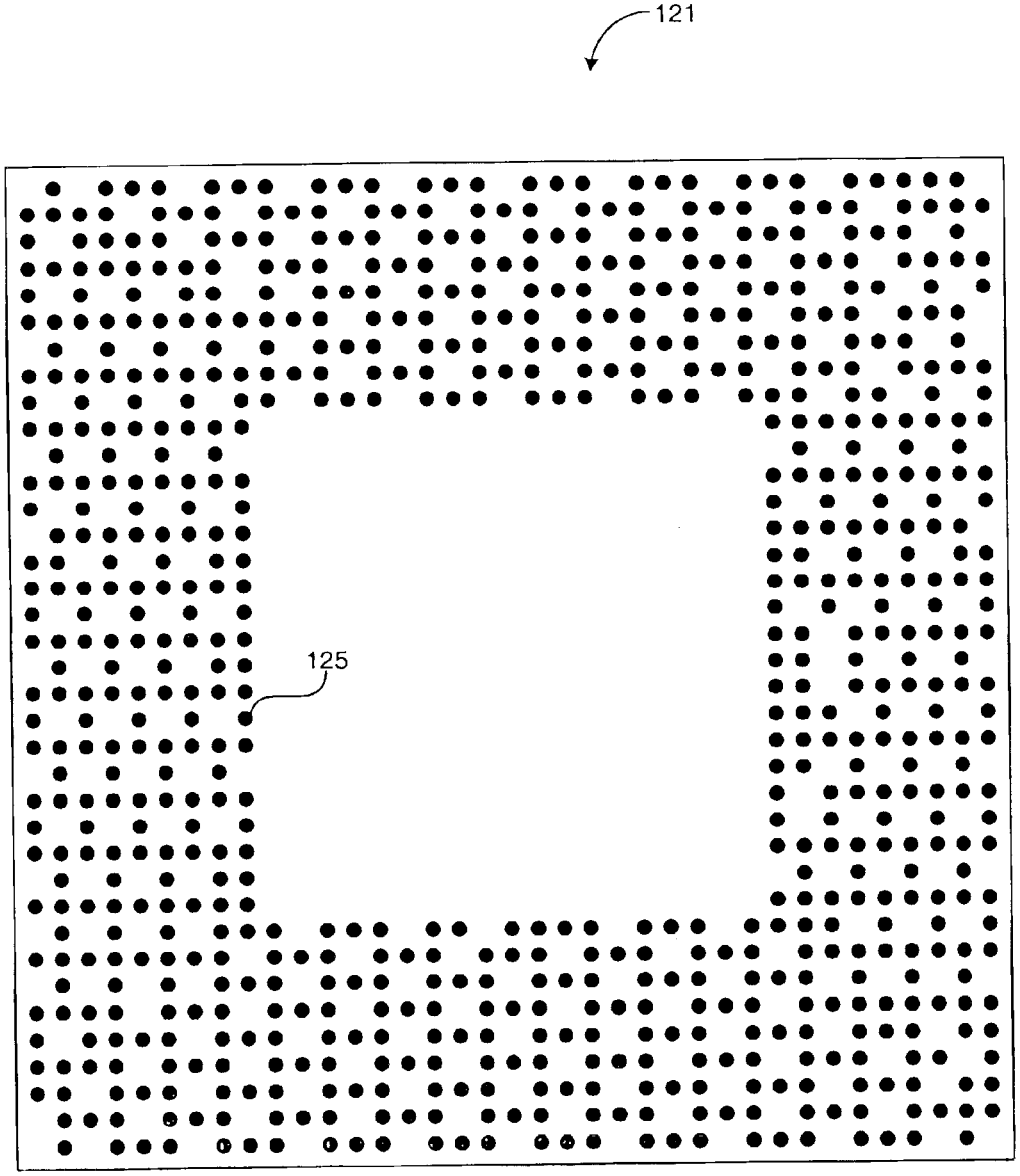
FIG. 2B is an illustration showing a bottom view of the package, in accordance with an exemplary embodiment of the present invention.

FIG. 2B is an illustration showing a bottom view of the package 121, in accordance with an exemplary embodiment of the present invention. The package 121 has a plurality of outer leads 125 capable of being used to attach the package 121 to another electronic component such as a printed circuit board. The plurality of outer leads 125 can be configured to implement any attachment mechanism common to those skilled in the art for attaching the package 121 to the other electronic component. For example, in one embodiment, the plurality of outer leads 125 could be configured as metal pins. In another embodiment, the plurality of outer leads 125 could be metal balls for use with a ball grid array attachment mechanism. The package 121 can also include additional pin-outs (not shown) inside a periphery defined by the plurality of outer leads 125. The additional pin-outs can be used to supply power to power planes within the package 121 that are ultimately connected to the number of core bumps.

Figure 3:
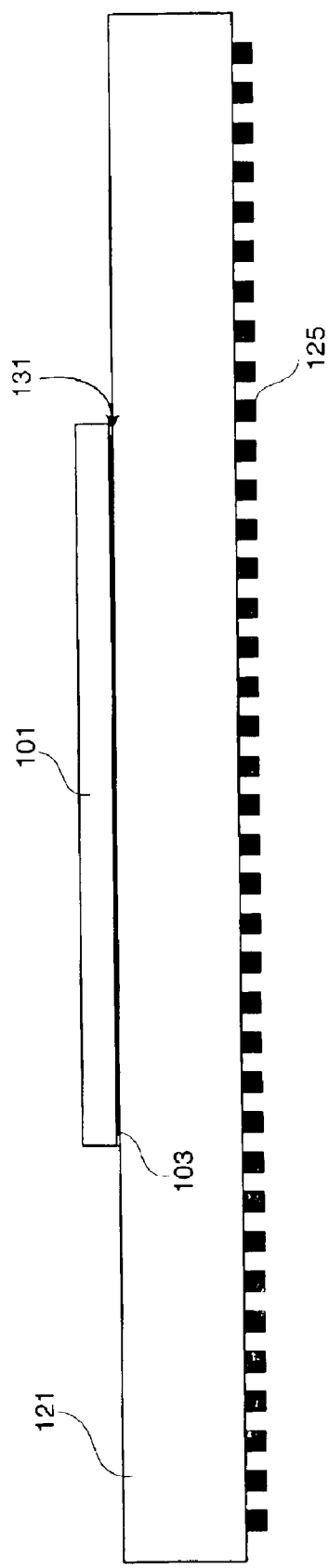
FIG. 3 is an illustration showing a side view of the die attached to the package, in accordance with an exemplary embodiment of the present invention.

FIG. 3 is an illustration showing a side view of the die 101 attached to the package 121, in accordance with an exemplary embodiment of the present invention. The plurality of die connection bumps 103 on the underside 105 of the die 101 create an interface 131 with the plurality of inner leads 123 at the top of the package 121. The plurality of outer leads 125 at the bottom of the package 121 are used to connect the package 121 to another electronic component. The interface 131 is not only a mechanical connection between the die 101 and the package 121, but also is an electrical connection causing the plurality of die connection bumps 103 to be electrically connected to the plurality of outer leads 125. In general, the package 121 incorporates larger electrical conductors relative to the die 101. Thus, the package 121 acts as a substantially robust lead system for connecting the die 101 to another electronic component.

Part of a die design process involves establishing an appropriate die connection bump layout. In broadest terms, the die connection bump layout is defined by a required number of die connection bumps, a signal or power assignment for each die connection bump, and an appropriate placement for each die connection bump that ensures successful routability through the package 121. The die connection bump layout is dependent on many die 101 and package 121 parameters that are subject to adjustment during the die 101 design process. A number of primary die 101 and package 121 parameters affecting the establishment of an appropriate die connection bump layout are described below.

A die connection bump diameter is one parameter affecting the establishment of an appropriate die connection bump layout. With advancement of package 121 technology, smaller die connection bump diameters are becoming more feasible. Also, the die connection bump diameter can be affected by limitations associated with the die 101 design characteristics. During the design process, characteristics of both the package 121 design and the die 101 design may require an adjustment of the die connection bump diameter.

A number of die connection bump rows is another parameter affecting the establishment of an appropriate die connection bump layout. Incorporation of multiple die connection bump rows is a standard feature in modem die 101 designs. However, a trend toward smaller die 101 sizes while maintaining a relatively fixed die connection bump diameter and die connection bump pitch introduces a need to incorporate a larger number of die connection bump rows. The number of die connection bump rows can also be established in part on the basis of power and signal assignments. For example, the outermost row of die connection bumps (i.e., closest to scribe side 109 of the die 101) may be reserved for input/output (IO) power assignments. The innermost row of die connection bumps (i.e., closest to the core 107 side of the die 101) may be reserved for a combination of core power and signal assignments. The interior rows of die connection bumps (i.e., between the innermost and outermost rows) are generally reserved for signal assignments. One design strategy is to establish the number of die connection bump rows having signal assignments to correspond to a number of metallization layers within the package 121 for routing signals from the package inner leads to the package outer leads. In this manner, a one-to-one correspondence can be established between a particular metallization layer within the package 121 and a particular row of die connection bumps having signal assignments.

An in-row pitch and an in-line pitch are additional parameters affecting the establishment of an appropriate die connection bump layout. The in-row pitch is defined as the center-to-center distance between adjacent die connection bump rows. Establishment of the in-row pitch considers constraints such as a required use of package capacitors for ensuring die power integrity. For example, the in-line pitch may be adjusted based on a number of package capacitors planned and their minimum trace widths, wherein the trace widths are to be located between die connection bump rows. The in-line pitch is defined as the center-to-center distance between adjacent die connection bumps within a given die connection bump row. In general, the in-line pitch is based on package 121 technology available and anticipated reductions in die 101 size.

A die connection bump count is another parameter affecting the establishment of an appropriate die connection bump layout. The die connection bump count is defined as a total number of die connection bumps required to correspond to a total number of IO signals, a power-to-signal ratio, and a number of spare die connection bumps. The total number of IO signals and the power-to-signal ratio are dictated by the die 101 design. The number of spare die connection bumps is established based on standard engineering practice and anticipated die 101 design changes.

A power-to-signal ratio is another parameter affecting the establishment of an appropriate die connection bump layout. The power-to-signal ratio is determined based on limitations associated with noise specifications, ground bounce, and power droop when multiple drivers are switching simultaneously. Essentially, the power-to-signal ratio is set such that a sufficient number of die connection bumps are assigned to carry power for a given number of die connection bumps that are assigned to carry IO signals. In following, the power-to-signal ratio is used in combination with the total number of IO signals to determine a total number of die connection bumps to receive power assignments. The power-to-signal ratio is also a design constraint for determining the proximity of die connection bumps having a power assignment relative to die connection bumps having an IO signal assignment. Generally, an iterative analysis is required to satisfy the noise specification and power-to-signal ratio requirements.

A die size is another parameter affecting the establishment of an appropriate die connection bump layout. The die size is defined by a length dimension and a width dimension corresponding to a rectangular perimeter. During the die 101 design process, it is common for the size and placement of die core blocks to undergo multiple changes. Each change to the size and placement of die core blocks has a potential impact on the overall die size. Placement of die connection bumps around the periphery of the die 101 must be redone each time the die size is changed.

A number of package layers is another parameter affecting the establishment of an appropriate die connection bump layout. As previously mentioned, the number of metallization layers within the package 121 for routing signals from the package inner leads to the package outer leads (i.e., signal layers) is a factor used to determine the number of die connection bump rows. Metallization layers within the package 121 are also commonly referred to as package planes. Ideally one row of die connection bumps is connected to one signal layer for routing to the outer leads of the package 121. Use of one signal layer per die connection bump row helps to avoid signal route crossings as signals are routed from the inner leads to the outer leads within the package 121. In addition to the signal layers, the package typically contains a plurality of metallization layers for transmitting power (i.e., power layers) to the various die connection bumps assigned to receive power. The number of power layers are generally separated into those for providing die core power and those for providing die IO power. The die connection bumps assigned to receive power are typically connected to vias within the package 121 that drop straight down to the appropriate power layer. Typically, a number of die connection bumps assigned to receive power will receive power from a common power layer. Thus, the number of package outer leads configured to receive power can be considerably less that the number of die connection bumps assigned to receive power. In addition to the signal layers and the power layers, the package can contain a number of metallization layers for grounding (i.e., ground layers). One design practice is to connect the die connection bumps assigned as ground for the die core power and the die IO power to a common ground layer. As with the die connection bumps assigned to receive power, the die connection bumps assigned to ground are typically connected to vias within the package 121 that drop straight down to the appropriate ground layer.

An arrangement of package outer leads is another parameter affecting the establishment of an appropriate die connection bump layout. The package outer leads are typically arranged on the underside of the package in a pattern consisting of a number of rows and a number of columns. The number of package outer lead rows and columns and their relative spacing from one another (i.e., pitch) has a direct affect on the routability of a particular inner lead to a particular outer lead. It is common for the arrangement of package outer leads to be fixed during the die 101 design process. Thus, the arrangement of package outer leads is not usually a parameter subject to change, but is an important parameter to consider when evaluating the routability of a prospective die connection bump layout.

A resistance match is another parameter affecting the establishment of an appropriate die connection bump layout. A mean resistance between a longest package trace and a shortest package trace is generally the resistance considered in the resistance match. Most high speed IO operations employ some form of impedance matching circuitry to reduce signal integrity issues resulting from a mismatched IO driver and a transmission line resistance. To comply with resistance matching requirements when determining an appropriate die connection bump layout, some die connection bumps may need to be placed in particular locations to ensure that the routing from their corresponding inner lead to outer lead has a resistance sufficient to satisfy the impedance matching circuitry.

A route symmetry, a route length, and a route shielding are other parameters that may affect the establishment of an appropriate die connection bump layout. Some die connection bumps connect to die circuitry that operates using differential voltage or performs timing operations such as a phase lock loop. These die connection bumps must be placed and routed from their corresponding inner lead to outer lead with consideration of special requirements related to routing symmetry, routing length, and noise shielding.

As illustrated by several of the previously discussed parameters, package 121 routing is a major consideration in establishing an appropriate die connection bump layout. Each die connection bump placement dictates the placement of its corresponding package inner lead. The signal assignment of each die connection bump/inner lead dictates the particular outer lead to which the die connection bump/inner lead must be routed. This is particularly true for successive generations of a die 101 design where the signal expected at each outer lead of the package 121 generally remains unchanged. The placement and assignment of each die connection bump should be evaluated to ensure the routability of each signal from its die connection bump/inner lead to its outer lead.

Figure 4:
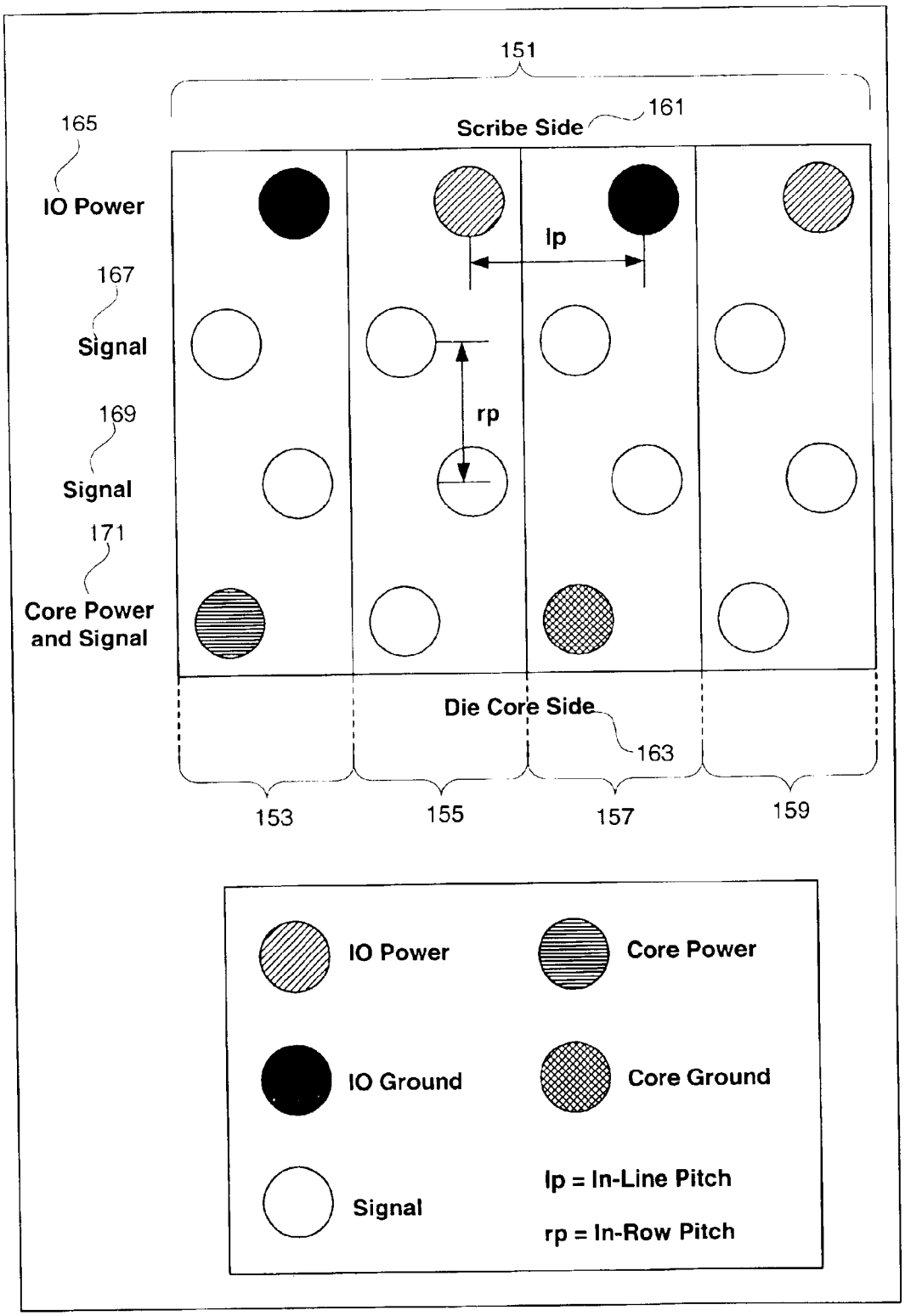
FIG. 4 is an illustration showing an exemplary die connection bump template, in accordance with an exemplary embodiment of the present invention.

FIG. 4 is an illustration showing an exemplary die connection bump template 151, in accordance with an exemplary embodiment of the present invention. The exemplary die connection bump template 151 includes four IO slices 153, 155, 157, and 159. Each IO slice includes four die connection bumps assigned to carry either IO power, core power, IO ground, core ground, or signal. The four die connection bumps within each IO slice are arranged to form four die connection bump rows designated as an IO power row 165, a signal row 167, a signal row 169, and a core power and signal row 171. The IO power row 165 is adjacent to a scribe side 161 of the die. The core power and signal row 171 is adjacent to a die core 163. Within each IO slice, adjacent die connection bumps (i.e., adjacent die connection bump rows) are separated by an in-row pitch (rp). Within each die connection bump row, adjacent die connection bumps are separated by an in-line pitch (lp). The die connection bump template 151 is repeated around the periphery of the die 101 to define the die connection bump layout. The various die connection bumps assigned to carry signals are assigned their signal based on a signal bump list. The signal bump list is an ordered listing of the various signals to be routed from the die 101 to the package outer leads as the periphery of the die 101 is traversed from a particular starting IO slice. The signal bump list can be adjusted during the die 101 design process to move a signal from one inner lead to another to assist in establishing an appropriate die connection bump layout that is routable within the package 121. Therefore, the die connection bump placements and assignments via the signal bump list can be adjusted to obtain a die connection bump layout that can be successfully routed from the plurality of inner leads through the package metallization layers to the plurality of outer leads.

Figure 5:
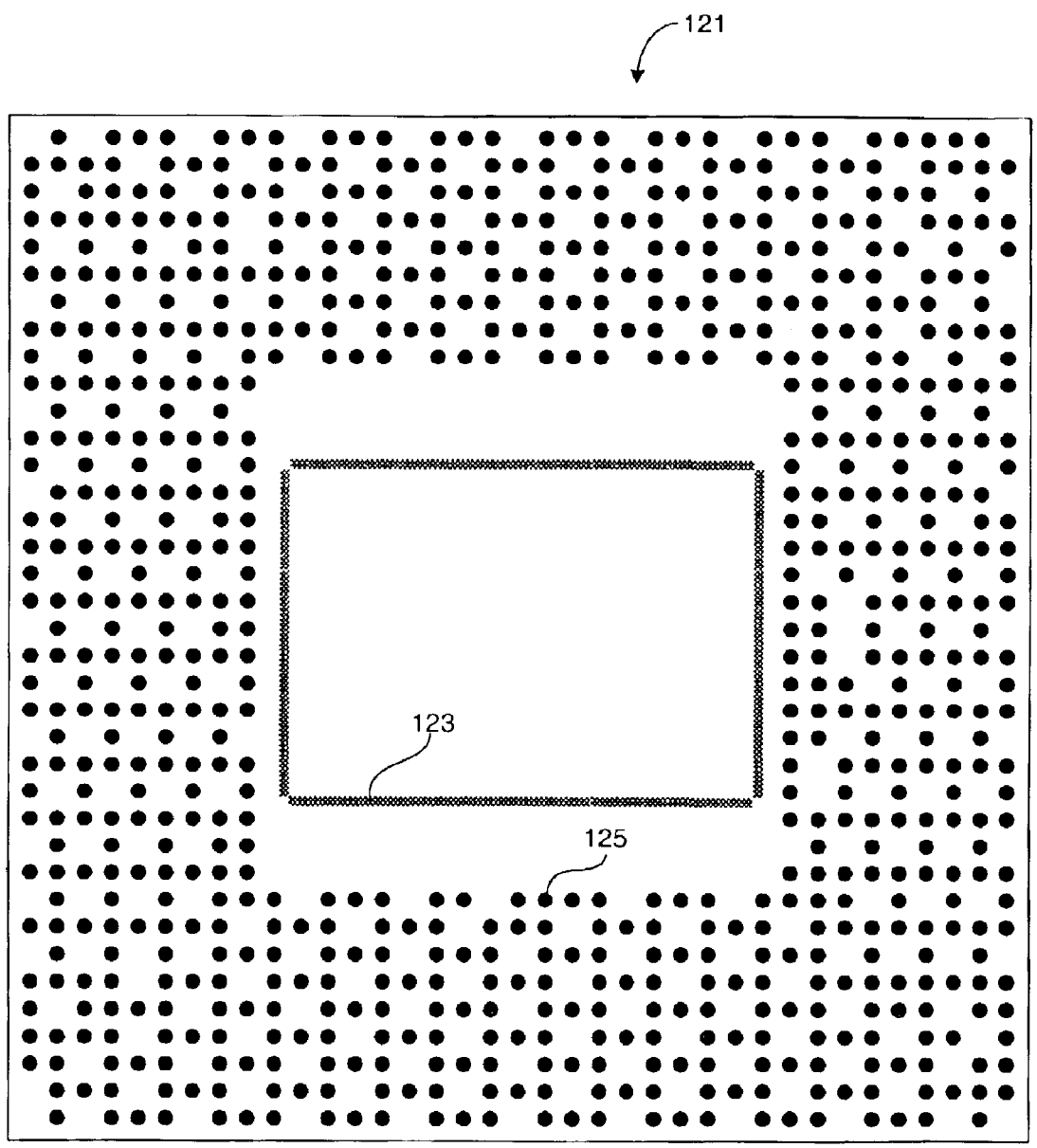
FIG. 5 is an illustration showing a bottom view of the package with the plurality of inner leads superimposed thereupon, in accordance with an exemplary embodiment of the present invention.

FIG. 5 is an illustration showing a bottom view of the package 121 with the plurality of inner leads 123 superimposed thereupon, in accordance with an exemplary embodiment of the present invention. Each of the plurality of inner leads 123 associated with a die connection bump assigned to carry a signal must be successfully routed to the correct one of the plurality of outer leads 125. Each inner lead corresponding to a given die connection bump row traversing the periphery of the die 101 is routed within a single metallization layer of the package 121. Considering the number of signals to be routed in modern die 101 designs, one design challenge is to route the various signals through the package 121 without having any routes cross each other. The crossing of one route with another route is commonly called a "rat crossing."

Figure 6:
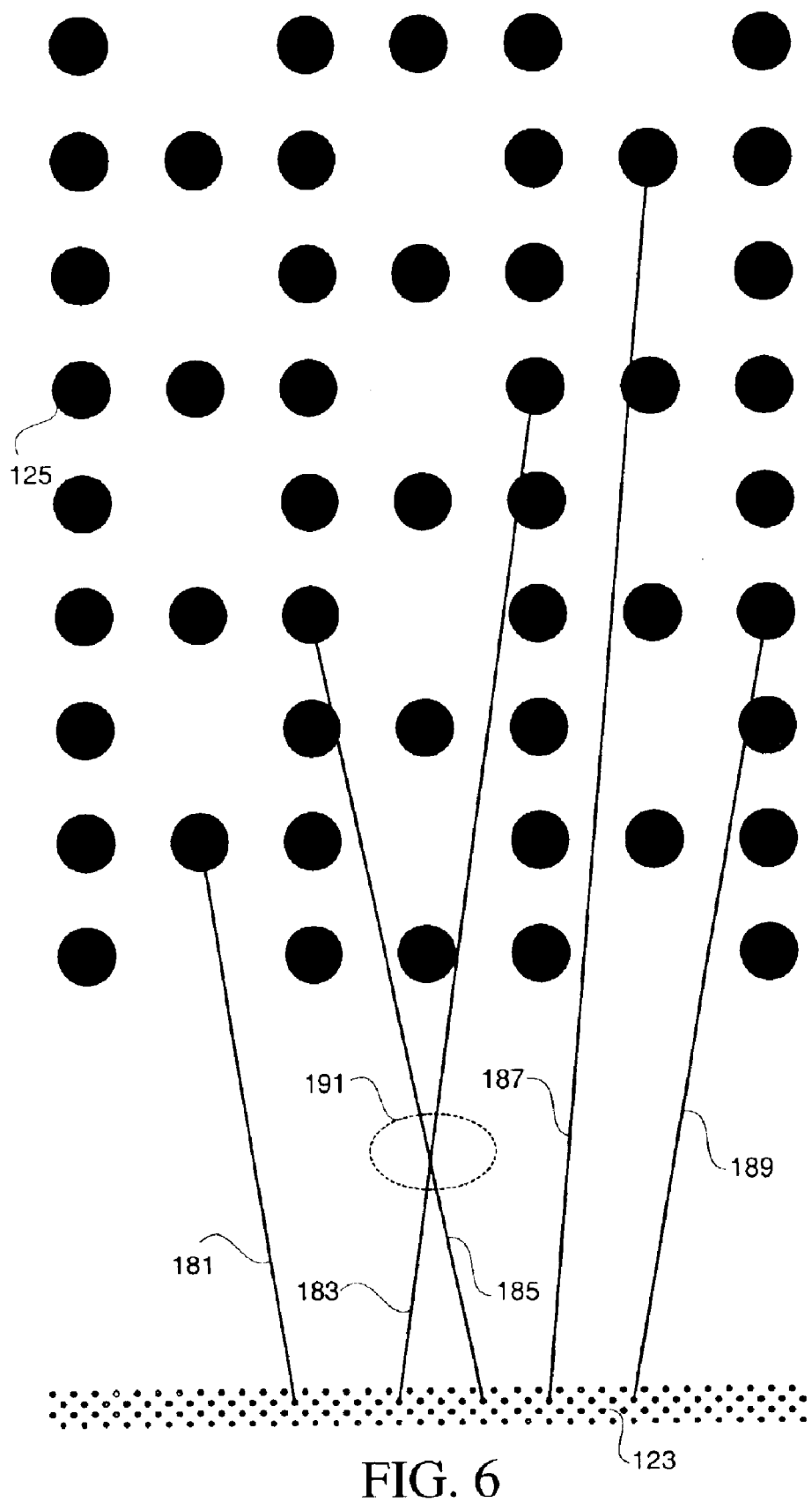
FIG. 6 is an illustration showing a rat crossing, in accordance with an exemplary embodiment of the present invention.

FIG. 6 is an illustration showing a rat crossing 191, in accordance with an exemplary embodiment of the present invention. The plurality of inner leads 123 and the plurality of outer leads 125 are shown in the same plane for illustrative purposes. Routings 181, 183, 185, 187, and 189 are all contained within the same metallization layer of the package 121. Routings 181, 187, and 189 are acceptable with respect to each other. However, routings 183 and 185 create a rat crossing 191. The rat crossing 191 would be a fatal defect preventing proper operation of the die 101. During final package 121 design, there may be a small amount of latitude with respect to routing adjustments to avoid rat crossings. However, to ensure that all routings can be successfully performed during final package 121 design, major rat crossings should be identified and dealt with during the die 101 design process by adjusting the die connection bump layout.

Die 101 and package 121 designs are dependent upon each other. To properly design IO drivers and receivers for the die 101, it is necessary to accurately model the package 121. Also, to accurately model the package 121, it is necessary to accurately model the die connection bump layout which defines the interface between the die 101 and the package 121. Traditionally, the dependent relationship between the die 101 and package 121 designs has required an iterative interface 131 design process involving both the die designer and the package designer. Usually, the interface design process would begin with the die designer providing the package designer with initial on-silicon die connection bump coordinates. The package designer would then attempt to route each inner lead (i.e., die connection bump) to its corresponding outer lead. If the package designer encountered an unavoidable rat crossing, a problematic portion of the die/package interface 131 would be communicated to the die designer for correction. The die designer would then attempt to correct the cause of the rat crossing by adjusting the die connection bump layout. The revised on-silicon die connection bump coordinates would then be sent back to the package designer for another routing iteration. This iterative process would continue until the die/package interface 131 satisfied all of the die 101 and package 121 design requirements. In addition, the die connection bump layout is subject to change, particularly in the initial phases of the die 101 design process, as the various parameters affecting the establishment of an appropriate die connection bump layout are modified. For each change in the die connection bump layout, the interactive process between the die and package designers to establish the die/package interface 131 must be repeated. Thus, iteration between the die and package designers can become costly in terms of time and expense. The present invention provides the die designer with a method and apparatus for efficiently evaluating package routings for a given die connection bump layout without recourse to the package designer.

Figure 7:
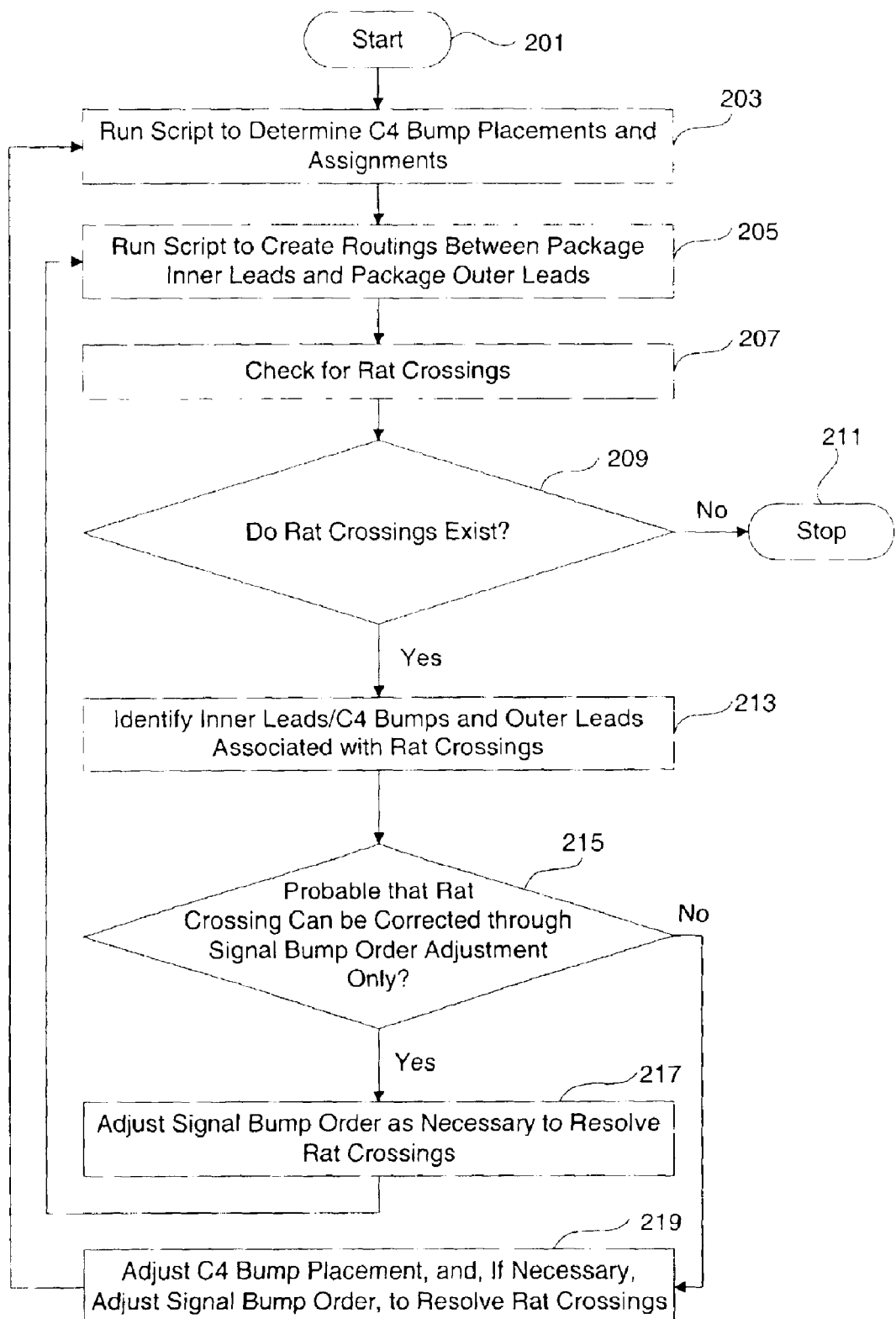
FIG. 7 shows a flowchart illustrating a method for the die designer to evaluate package routing without recourse to the package designer, in accordance with one embodiment of the present invention.

FIG. 7 shows a flowchart illustrating a method for the die designer to evaluate package routings without recourse to the package designer, in accordance with one embodiment of the present invention. The method begins at a starting block 201. In an operation 203, a first script program is run to automatically establish a die connection bump layout in terms of placement and assignment for each die connection bump around the periphery of the die 101. In one embodiment of the present invention, the first script program can be implemented using the Perl script language. However, it should be understood that other available programming platforms can be used to perform the operation 203. In an operation 205, a second script program is run to create routings between package inner leads, corresponding to die connection bumps, and associated package outer leads. In one embodiment of the present invention, the second script program can be implemented using a Skill script language for use with an Opus die design tool. However, it should be understood that other available programming platforms can be used to perform the operation 205. In an operation 207, the die designer examines the routings created between inner and outer leads within each package metallization layer to identify rat crossings. In one embodiment, the routings are examined visually to identify rat crossings. The die designer may exercise discretion when examining the routings to identify rat crossings. For example, in one embodiment, the die designer may choose to only identify major rat crossings. Hence, the die designer may choose to refrain from identifying routings as rat crossings based on a close proximity with indiscernible contact. In an operation 209, the die designer makes a decision based on the existence of any rat crossings. If rat crossings do not exist, the method concludes at an ending block 211. However, if rat crossings do exist, the method continues with an operation 213 in which the routings associated with the rat crossings are identified in terms of their inner leads/die connection bumps and outer leads. In an operation 215, the die designer makes a decision based on the probability that the rat crossing is correctable through signal bump order adjustment only. If the rat crossing is likely to be resolved through signal bump order adjustment only, an operation 217 is performed in which the signal bump order is adjusted to resolve the rat crossing. The method then continues by looping back to the operation 205 in which the second script program is run to create routings between package inner leads, corresponding to die connection bumps, and associated package outer leads. With respect to the operation 215, if the die designer makes a decision that the rat crossing is not likely to be resolved through signal bump order adjustment only, an operation 219 is performed. In the operation 219, the die connection bump placement around the periphery of the die 101 is adjusted to resolve the rat crossing. This die connection bump placement adjustment can be performed by modifying one or more parameters affecting the die connection bump placement (e.g., number of die connection bump rows, in-row pitch, in-line pitch, die size, etc . . . ).

The die connection bump placement adjustment may also be accompanied by a signal bump order adjustment. The method then continues by looping back to the operation 203 in which the first script program is run to automatically establish the die connection bump layout in terms of placement and assignment for each die connection bump around the periphery of the die 101.

Figure 8:
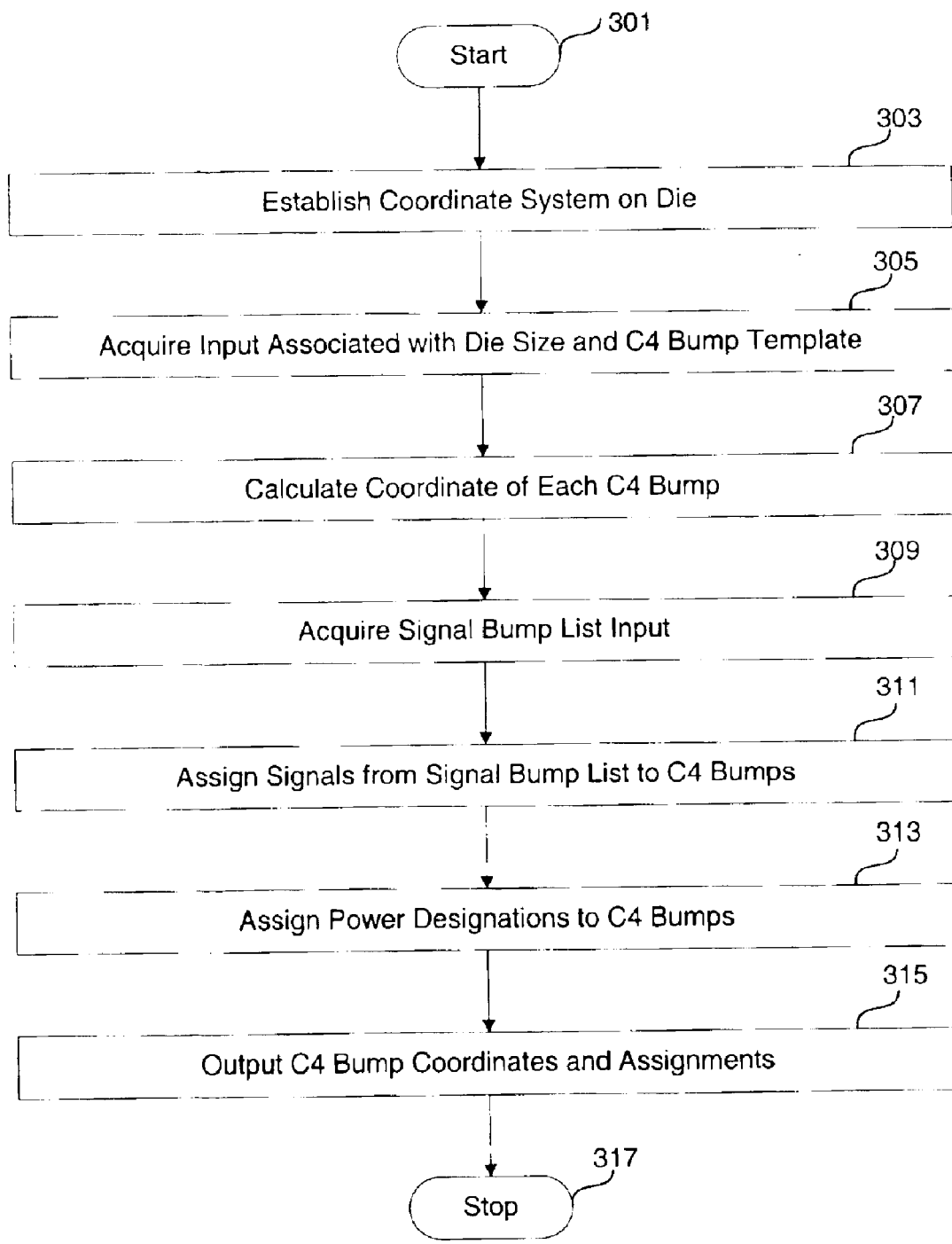
FIG. 8 shows a flowchart illustrating a method for implementing the first script program for automatically establishing a die connection bump layout in terms of placement and assignment for each die connection bump around the periphery of the die, in accordance with one embodiment of the present invention.

FIG. 8 shows a flowchart illustrating a method for implementing the first script program for automatically establishing a die connection bump layout in terms of placement and assignment for each die connection bump around the periphery of the die 101, in accordance with one embodiment of the present invention. The method begins at a starting block 301. In an operation 303, a coordinate system is established on the die 101. In one embodiment the coordinate system may be Cartesian. However, other embodiments may use alternative coordinate systems appropriate to the geometry of the die 101 and package 121. In an operation 305, input associated with the die size and die connection bump template is acquired. In one embodiment of the present invention, the input acquired in the operation 305 may include the following: a die length, a die width, a total number of signal bumps, an in-line pitch, an in-row pitch, a bump radius, a perpendicular distance from a center of an outer die connection bump row to an outer edge of the die 101, an extra distance to be inserted between the outer die connection bump row and an adjacent interior bump row, and a definition for each IO slice pattern to be applied in a die connection bump template. In other embodiments, more or less descriptive information may be acquired in the operation 305 so long as enough information is acquired to fully develop the die connection bump coordinates such that they comply with a set of established die design requirements. The method continues with an operation 307 in which a coordinate is calculated for each die connection bump around the periphery of the die 101 based on the input acquired in the operation 305. In an operation 309, a signal bump list input is acquired. In one embodiment, the signal bump list is an ordered listing of the various signals to be routed from the die 101 to the package outer leads as the periphery of the die 101 is traversed from a particular starting IO slice. As previously mentioned, the signal bump list can be adjusted during the die design process to move a signal from one inner lead to another to assist in establishing an appropriate die connection bump layout that is routable within the package 121. In an operation 311, signals from the signal bump list are assigned to die connection bumps around the periphery of the die 101. In an operation 313, power designations are assigned to die connection bumps around the periphery of the die 101 based on the input acquired in the operation 305. In an operation 315, coordinates and assignments for each die connection bump around the periphery of the die 101 are output for subsequent use in the method previously described with respect to FIG. 7.

Figure 9:
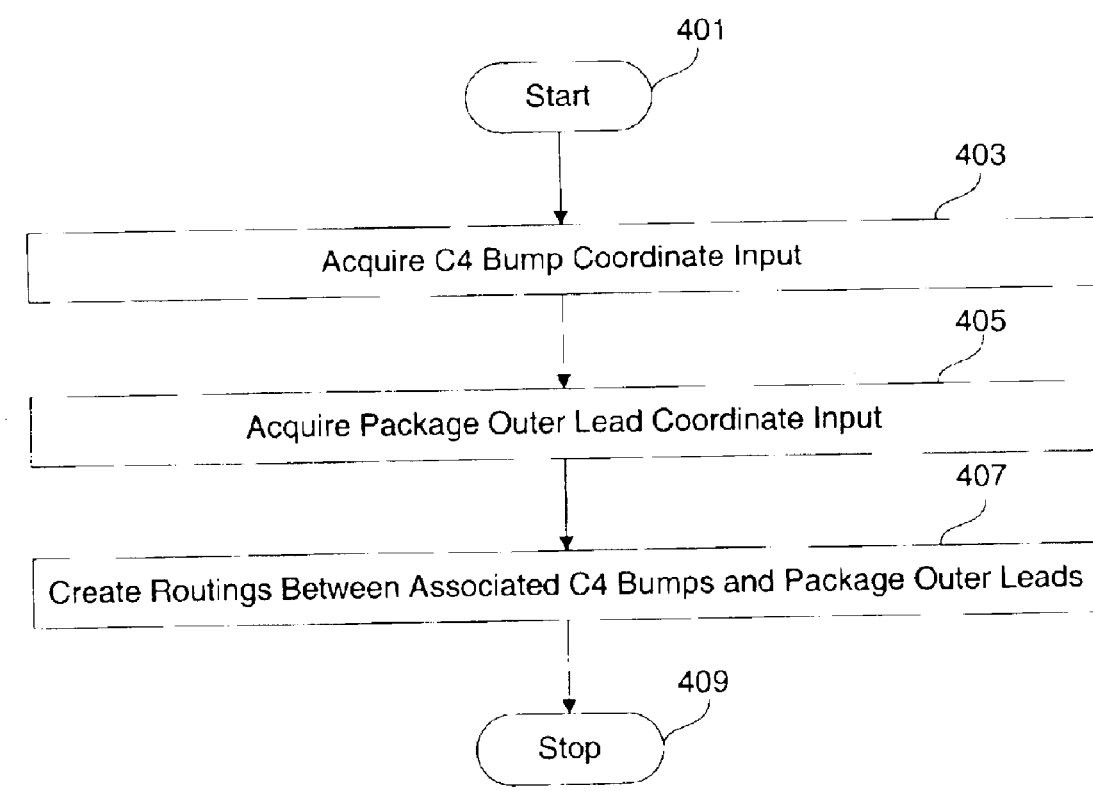
FIG. 9 shows a flowchart illustrating a method for implementing the second script program for creating routings between package inner leads, corresponding to die connection bumps, and associated package outer leads, in accordance with one embodiment of the present invention.

FIG. 9 shows a flowchart illustrating a method for implementing the second script program for creating routings between package inner leads, corresponding to die connection bumps, and associated package outer leads, in accordance with one embodiment of the present invention. The method begins at a starting block 401. In an operation 403, die connection bump/package inner lead coordinate input is acquired. In one embodiment, the die connection bump/package inner lead coordinate input is provided in terms of a coordinate system that is common to both the die 101 and package 121. However, in other embodiments, the die 101 and package 121 can have separate coordinate systems with a known translation between the separate coordinate systems. In an operation 405, package outer lead coordinate input is acquired. In an operation 407, routings are created between associated die connection bump/package inner lead coordinates and package outer lead coordinates. In one embodiment, the routings are visually represented in as linear routings. The linear routings can be displayed separately for each die connection bump row traversing the periphery of the die 101. In this manner linear routings associated with a given package metallization layer can be more easily examined as previously described with respect to FIG. 7. The method then concludes at an ending block 409.

Using the methods described in FIGS. 7, 8, and 9, the die designer is capable of evaluating the package routability of a die connection bump layout without having to iterate with the package designer. Thus, as the die design process proceeds and the various parameters affecting the establishment of an appropriate die connection bump layout are modified, the die designer can use the present invention to quickly re-evaluate the package routability. Hence, significant rat crossing issues are identified and resolved by the die designer without recourse to the package designer. Thus, the present invention contributes to a savings of time and expense with respect to the die design process.

Additionally, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for establishing a die connection bump layout for a die that is routable within a package, comprising:
    computing a plurality of die connection bump locations and assignments, wherein the plurality of die connection bump locations are defined around a periphery of the die and correspond to a plurality of package inner lead locations;
    computing a plurality of routings between the plurality of package inner lead locations and a plurality of package outer lead locations, the plurality of package outer lead locations being defined around a periphery of the package, the periphery of the die being smaller than the periphery of the package;
    identifying rat crossings within the plurality of routings, a rat crossing occurring where an intersection exists between routings of the plurality of routings; and
    modifying the die connection bump layout to avoid the identified rat crossings.

2. A method for establishing a die connection bump layout for a die that is routable within a package as recited in claim 1, wherein computing the plurality of die connection bump locations and assignments is performed by a computer executable program implemented using a Perl programming language.

3. A method for establishing a die connection bump layout for a die that is routable within a package as recited in claim 1, wherein computing the plurality of routings between the plurality of package inner lead locations and the plurality of package outer lead locations is performed by a computer executable program implemented using a Skill script language, the Skill script language being interpretable by an Opus die design tool.

4. A method for establishing a die connection bump layout for a die that is routable within a package as recited in claim 1, wherein computing the plurality of die connection bump locations and assignments comprises:
    establishing a coordinate system on the die;
    acquiring a first plurality of inputs necessary to define a die size and a die connection bump template;
    using the first plurality of inputs to calculate a coordinate within the coordinate system on the die for each of the plurality of die connection bump locations;
    acquiring a second plurality of inputs necessary to determine an assignment for each of the plurality of die connection bump locations;
    designating a signal assignment to a number of die connection bump locations;
    designating a power assignment to a number of die connection bump locations; and
    outputting the coordinate and the assignment for each of the plurality of die connection bump locations.

5. A method for establishing a die connection bump layout for a die that is routable within a package as recited in claim 4, wherein the first plurality of inputs comprises:
    a die length;
    a die width;
    a total number of signal bumps;
    an in-line pitch;
    an in-row pitch;
    a die connection bump radius;
    a perpendicular distance from a center of an outer die connection bump row to an outer edge of the die;
    an extra distance to be inserted between the outer die connection bump row and an adjacent interior die connection bump row; and
    a definition for each of a plurality of IO slice patterns to be applied in a die connection bump template.

6. A method for establishing a die connection bump layout for a die that is routable within a package as recited in claim 4, wherein the second plurality of inputs comprises a signal bump list, wherein the signal bump list contains an ordered listing of signals to be routed from the die to the plurality of package outer lead locations as a periphery of the die is traversed from a specified starting location.

7. A method for establishing a die connection bump layout for a die that is routable within a package as recited in claim 1, wherein computing the plurality of routings between the plurality of package inner lead locations and the plurality of package outer lead locations comprises:
    acquiring a first plurality of inputs, the first plurality of inputs including a coordinate on the die corresponding to each of the plurality of die connection bump locations;
    acquiring a second plurality of inputs, the second plurality of inputs including a coordinate on the package corresponding to each of the plurality of package outer lead locations; and
    creating the plurality of routings between the plurality of package inner lead locations and the plurality of package outer lead locations, wherein each of the plurality of routings is a linear routing between a package inner lead and a package outer lead, the package inner lead and the package outer lead having a common signal assignment.

8. A method for establishing a die connection bump layout for a die that is routable within a package as recited in claim 7, wherein the plurality of routings created for a single die connection bump row are created within a single metallization layer of the package.

9. A method for establishing a die connection bump layout for a die that is routable within a package as recited in claim 1, wherein the plurality of routings between the plurality of package inner lead locations and the plurality of package outer lead locations are created as a visual representation.

10. A method for establishing a die connection bump layout for a die that is routable within a package as recited in claim 9, wherein identifying rat crossings within the plurality of routings is performed by a visual inspection.

11. A method for establishing a die connection bump layout for a die that is routable within a package as recited in claim 1, wherein modifying the die connection bump layout to avoid rat crossings includes performing one of the following:
   adjusting a signal bump order, wherein the signal bump order defines the plurality of die connection bump assignments;
   adjusting the plurality of die connection bump locations; and
   adjusting both the signal bump order and the plurality of die connection bump locations.

12. A method for establishing a die connection bump layout for a die that is routable within a package as recited in claim 1, wherein the method is performed by a die designer prior to releasing the die connection bump layout to a package designer.

13. A method for determining a plurality of die connection bump locations and assignments, comprising:
   establishing a coordinate system on a die;
   acquiring a first plurality of inputs necessary to define a die size and a die connection bump template;
   using the first plurality of inputs to calculate a coordinate within the coordinate system on the die for each of the plurality of die connection bump locations;
   acquiring a second plurality of inputs necessary to determine an assignment for each of the plurality of die connection bump locations;
   designating a signal assignment to a number of die connection bump locations;
   designating a power assignment to a number of die connection bump locations;
   outputting the coordinate and the assignment for each of the plurality of die connection bump locations;
   using the output coordinate and assignment for each of the plurality of die connection bump locations to compute a plurality of routings through a package to which the die is to be attached; and
   identifying rat crossings within the computed plurality of routings, a rat crossing occurring where an intersection exists between routings of the plurality of routings.

14. A method for determining a plurality of die connection bump locations and assignments as recited in claim 13, wherein the first plurality of inputs comprises:
   a die length;
   a die width;
   a total number of signal bumps;
   an in-line pitch;
   an in-row pitch;
   a die connection bump radius;
   a perpendicular distance from a center of an outer die connection bump row to an outer edge of the die;
   an extra distance to be inserted between the outer die connection bump row and an adjacent interior die connection bump row; and
   a definition for each of a plurality of IO slice patterns to be applied in a die connection bump template.

15. A method for determining a plurality of die connection bump locations and assignments as recited in claim 13, wherein the second plurality of input comprises a signal bump list, wherein the signal bump list contains an ordered listing of signals to be routed from the die to a plurality of package outer leads as a periphery of the die is traversed from a specified starting location.

16. A computer program embodied on a computer readable medium for determining a plurality of die connection bump locations and assignments, the computer program comprising:
   program instructions for establishing a coordinate system on a die;
   program instructions for acquiring a first plurality of inputs necessary to define a die size and a die connection bump template;
   program instructions for using the first plurality of inputs to calculate a coordinate within the coordinate system on the die for each of the plurality of die connection bump locations;
   program instructions for acquiring a second plurality of inputs necessary to determine an assignment for each of the plurality of die connection bump locations;
   program instructions for designating a signal assignment to a number of die connection bump locations;
   program instructions for designating a power assignment to a number of die connection bump locations;
   program instructions for outputting the coordinate and the assignment for each of the plurality of die connection bump locations;
   program instructions for using the output coordinate and assignment for each of the plurality of die connection bump locations to compute a plurality of routings through a package to which the die is to be attached; and
   program instructions for identifying rat crossings within the computed plurality of routings, a rat crossing occurring where an intersection exists between routings of the plurality of routings.

17. A computer program embodied on a computer readable medium for determining a plurality of die connection bump locations and assignments as recited in claim 16, wherein the first plurality of inputs comprises:
   a die length;
   a die width;
   a total number of signal bumps;
   an in-line pitch;
   an in-row pitch;
   a die connection bump radius;
   a perpendicular distance from a center of an outer die connection bump row to an outer edge of the die;
   an extra distance to be inserted between the outer die connection bump row and an adjacent interior die connection bump row; and
   a definition for each of a plurality of IO slice patterns to be applied in a die connection bump template.

18. A computer program embodied on a computer readable medium for determining a plurality of die connection bump locations and assignments as recited in claim 16, wherein the second plurality of inputs comprises a signal bump list, wherein the signal bump list contains an ordered listing of signals to be routed from the die to a plurality of package outer leads as a periphery of the die is traversed from a specified starting location.

19. A computer program embodied on a computer readable medium for determining a plurality of die connection bump locations and assignments as recited in claim 16, wherein the computer program is implemented using a Perl programming language.

20. A method for creating a plurality of package routings, comprising:

acquiring a first plurality of inputs, the first plurality of inputs including coordinates on a die corresponding to each of a plurality of die connection bump locations, wherein each of the plurality of die connection bump locations corresponds to a location of one of a plurality of package inner leads;

acquiring a second plurality of inputs the second plurality of input including coordinates on a package corresponding to each of a plurality of package outer leads;

creating a plurality of routings between the plurality of package inner leads and the plurality of package outer leads, wherein each of the plurality of routings is a linear routing traversing a shortest possible distance between a package inner lead and a package outer lead having a common signal assignments;

identifying rat crossings within the plurality of routings, a rat crossing occurring where an intersection exists between routings of the plurality of routings; and modifying the coordinates of the plurality of die connection bump locations in the first plurality of input as necessary to avoid the identified rat crossings.

21. A method for creating a plurality of package routings as recited in claim 20, wherein the plurality of routings created for a single die connection bump row are created within a single metallization layer of the package.

22. A method for creating a plurality of package routings as recited in claim 20, wherein the plurality of routings between the plurality of package inner leads and the plurality of package outer leads are created as a visual representation.

23. A computer program embodied on a computer readable medium for creating a plurality of package routings, the computer program comprising:

program instructions for acquiring a first plurality of inputs the first plurality of inputs including coordinates on a die corresponding to each of a plurality of die connection bump locations, wherein each of the plurality of die connection bump locations corresponds to a location of one of a plurality of package inner leads;

program instructions for acquiring a second plurality of inputs, the second plurality of inputs including coordinates on a package corresponding to each of a plurality of package outer leads;

program instructions for creating a plurality of routings between the plurality of package inner leads and the plurality of package outer leads, wherein each of the plurality of routings is a linear routing traversing a shortest possible distance between a package inner lead and a package outer lead having a common signal assignment;

program instructions for identifying rat crossings within the plurality of routings, a rat crossing occurring where an intersection exists between routings of the plurality of routings; and program instructions for modifying the coordinates of the plurality of die connection bump locations in the first plurality of input as necessary to avoid the identified rat crossings.

24. A computer program embodied on a computer readable medium for creating a plurality of package routings as recited in claim 23, wherein the program instructions for creating the plurality of routings include program instructions for creating routings for a single die connection bump row within a single metallization layer of the package.

25. A computer program embodied on a computer readable medium for creating a plurality of package routings as recited in claim 23, wherein the program instructions for creating the plurality of routings include program instructions for creating a visual representation of the plurality of routings.

26. A computer program embodied on a computer readable medium for creating a plurality of package routings as recited in claim 23, wherein the computer program is implemented using a Skill programming language, the Skill programming language being interpretable by an Opus die design tool.

\* \* \* \* \*